(12) United States Patent
Dunning (10) Patent No.: US 10,268,781 B2
(45) Date of Patent: Apr. 23, 2019

(54) VISUAL MODELING APPARATUSES, METHODS AND SYSTEMS

(71) Applicant: Paddy Dunning, Dublin (IE)

(72) Inventor: Paddy Dunning, Dublin (IE)

(*) Notice: Subject to any disclaimer, the term of this patent is extended or adjusted under 35 U.S.C. 154(b) by 285 days.

(21) Appl. No.: 15/044,826

(22) Filed: Feb. 16, 2016

(65) Prior Publication Data

US 2017/0004228 A1 Jan. 5, 2017

Related U.S. Application Data

(63) Continuation-in-part of application No. 29/532,051, filed on Jul. 1, 2015, now abandoned.

(51) Int. Cl.
| | |
|---|---|
| *G06T 19/20* | (2011.01) |
| *G06F 17/50* | (2006.01) |
| *G06T 13/40* | (2011.01) |
| *H04N 5/74* | (2006.01) |
| *H05B 33/14* | (2006.01) |

(52) U.S. Cl.
CPC .......... *G06F 17/5004* (2013.01); *G06T 13/40* (2013.01); *G06T 19/20* (2013.01); *H04N 5/7458* (2013.01); *H05B 33/145* (2013.01)

(58) Field of Classification Search
CPC ....... G06T 19/20; G06T 13/40; H04N 5/7458; H05B 33/145; H05B 37/0272; A61B 5/1124; A61B 5/064; H04L 67/12; G06K 9/3216; G01S 5/02
See application file for complete search history.

(56) References Cited

U.S. PATENT DOCUMENTS

| | | | | |
|---|---|---|---|---|
| 8,111,284 B1* | 2/2012 | Givon | ................. | G06K 9/3216 345/474 |
| 2009/0153565 A1* | 6/2009 | Anderson | ............... | G06T 13/40 345/473 |
| 2012/0185218 A1* | 7/2012 | Bickel | .................... | G06T 19/20 703/1 |
| 2013/0198786 A1* | 8/2013 | Cook | ................. | H05B 37/0272 725/81 |
| 2013/0201316 A1* | 8/2013 | Binder | .................... | H04L 67/12 348/77 |
| 2013/0237811 A1* | 9/2013 | Mihailescu | ............ | A61B 5/064 600/424 |
| 2014/0153794 A1* | 6/2014 | Varaklis | ............... | A61B 5/1124 382/128 |
| 2014/0368378 A1* | 12/2014 | Crain | ........................ | G01S 5/02 342/25 A |
| 2015/0154783 A1* | 6/2015 | Grundhofer | ......... | H04N 5/7458 348/745 |
| 2016/0183346 A1* | 6/2016 | Hsing | .................. | H05B 33/145 362/293 |

* cited by examiner

*Primary Examiner* — Kandasamy Thangavelu
(74) *Attorney, Agent, or Firm* — Boisbrun Hofman, PLLC (57) ABSTRACT

The VISUAL MODELING APPARATUSES, METHODS AND SYSTEMS ("VISUAL MODELING SYSTEM") transforms and maps visual imagery, photographs, video and the like onto a large scale model or Giant using a matrix of embedded lighting elements in the structure to create a large scale visitor and entertainment attraction.

11 Claims, 5 Drawing Sheets

VISUAL MODELING APPARATUSES, METHODS AND SYSTEMS

This application for letters patent disclosure document describes inventive aspects that include various novel innovations (hereinafter "disclosure") and contains material that is subject to copyright and/or other intellectual property protection. The respective owners of such intellectual property have no objection to the facsimile reproduction of the disclosure by anyone as it appears in published Patent Office file/records, but otherwise reserve all rights.

PRIORITY CLAIM

Applicant hereby claims priority under 35 USC §§ 120 to pending U.S. patent application Ser. No. 29/532,051, filed Jul. 1, 2015, entitled "ANDROGYNOUS STATUE."

The entire content of the aforementioned application is herein expressly incorporated by reference.

FIELD

The present innovations generally relates to a visual tourist attraction system and method for the entertainment and tourism industry and more particularly, includes VISUAL MODELING APPARATUSES, METHODS AND SYSTEMS which may be used to create and generate large scale visual models on sculptures and other objects.

BACKGROUND

Major entertainment and tourist attractions from landmark structures to entertainment complexes, such as, Disney World, Times Square and Grand Central Station in the U.S. and others throughout the world, receive tens of millions of visitors every year. To keep visitors engaged there is always a need for new and novel ways to attract visitors' attention and create those awe inspiring reactions that keep visitors returning and encouraging others to visit. There are a broad range of attractions from those that create thrills, like roller coasters and other amusement park rides that soar ever high and faster, to those that are visually awe inspiring like the Eiffel Tower or Mount Rushmore. While these known visually awe inspiring attractions are undoubtedly impressive, there is a need for more engaging and interactive visual attractions that will keep generations of visitors captivated.

SUMMARY

This disclosure details implementations of apparatuses, methods and systems for visually modeling an object via transformation and mapping of scanned object data onto an addressable matrix of lighting elements embedded in a large scale model or sculpture of the object or, in essence, modeling the object onto a "Giant" version of itself. The scanned and mapped data is used as a map to energize the lighting elements to create a representation of the scanned object on the large scale model. The model is preferably ten or more times greater in size than the original scanned object to create an awe inspiring visual attraction.

In one embodiment of the system and method the object is preferably a person visiting the attraction and the large scale model or sculpture is in the form of a standing human wherein the scanned features of the person visiting the attraction can be mapped to the corresponding features of the large scale model. In particular, facial features, hair, clothing and other unique and defining aspects of the visitor are scanned and modeled so that the visitor's likeness is modeled on the large scale sculpture that can be seen from all around.

In other embodiments of the invention, the subject or object may be repeatedly scanned to generate a video, whereby the video can be modeled on the sculpture. In yet other embodiments the scan is a three dimensional scan and the large scale structure is similarly shaped to correspond to the three dimensional shape of the object to be scanned. In yet other embodiments stored videos, photos, abstracts or texture can also be mapped to the structure. In yet other embodiments the structure is equipped with actuators that permit movement of portions of the structure, such as, the arms, legs and head in a human form structure. In various embodiments, the actuators may be implemented using known hydraulic or pneumatic cylinders or pistons, electric motors or shape memory alloys, or any other mechanical translation system.

Other aspects and embodiments of the disclosure will become apparent from the following brief description of the drawings in conjunction with the detailed description.

BRIEF DESCRIPTION OF THE DRAWINGS

The accompanying drawings illustrate various non-limiting, examples, and innovative aspects in accordance with the present descriptions.

DETAILED DESCRIPTION

The visual modeling system described herein provides a system and method for creating an awe inspiring amusement and entertainment structure. The vast majority of large structures today are static and unless having some historic significance are generally of fleeting interest as attractions. The system and method disclosed herein creates a unique and appealing attraction by creating an interactive large scale structure that can be used to model a smaller figure on a large scale.

In various embodiments, the system can be used to scan and generate a three dimensional ("3D") representational image of a person such as a visitor to the attraction and then the representation can be modeled on the large scale structure. Various other embodiments may also include movement by means of both streaming video of the visitor and moveable appendages that can be controlled by a visitor to the attraction.

In simple terms, in one preferred embodiment each person or visitor entering the visitor attraction will enter a 3D scanner and their image, video and audio will be scanned and digitized using known scanning and recording techniques. The data will then be processed and transposed to a corresponding matrix map of lighting elements embedded in the structure so that the visitor's likeness may be replicated on the large scale structure. The audio-video image may also be scanned remotely or acquired from stored data, such as, to replicate celebrities or other famous figures, and be transmitted and or saved to be uploaded at a later time on a large scale "Giant" structure.

Referring to FIGS. 1*a*-1*f*, there is shown an illustration of a large scale structure of one embodiment of the system and method wherein the object to be modeled is a human form. In this embodiment the large scale visual modeling structure is built in the form of a standing human figure having a head, arms, torso and legs built upon a pedestal. While the embodiments depicted herein are a human form, any 3D object could be modeled with the appropriate form, for example, structures might be built to represent or model dinosaurs or other animals.

The large scale structures may be built by any know construction means such as steel or wood frame construction and may be skinned or unskinned. In one embodiment the structure is constructed from a wood frame with horizontal rendering slats or framing defining the form of the object to be modeled. In some embodiments, the front edges of the segments of wood or another material from which the structure or Giant is constructed, may be covered with a transparent skin, such as, a diffusion Plexiglass. Addressable lighting elements may be mounted and recessed behind the glass or other see through membrane. In some embodiments the lighting elements are preferably clusters of red, green and blue light emitting diodes, however, any known light emitter may be used.

The lighting elements may be placed at varying depths of recess and the pitch of the pixels may be varied to alter the visual appearance of each pixel. By controlling the pitch and depth of the lighting elements the visual appearance may be configured to create sharp edges or vast pixels that blending into each other.

The array or matrix of lighting elements on the structure will preferably cover the entire structure, including the front, back and sides. The pixel resolution or distribution, density or size of lighting elements on the structure may be uniform and consistent, or in some embodiments may be distributed to provide finer resolution in critical areas of the structure. For example, in a human form structure of one embodiment, the majority of the horizontal segments in the structure, which in aggregate create the body of the sculpture, may be mounted with large pixels having a horizontal pitch of approximately 25 cm. The head—excluding the face—and the front torso may be constructed of 4000 medium-pitch pixels with a horizontal pitch of approximately 10 cm. In some embodiments, the vertical pitch is preferably determined by the distance between the individual segments of horizontal structure. The segments creating the face are in aggregate in one embodiment embedded with 3,000 small pixels with approximately 5 cm pixel pitch sufficient for viewing distances of more than 50 m as well as coherent images being visible while standing directly in front of the structure. These exemplary pixel/lighting element distributions in one embodiment may be used on a structure of 10 stories—it will be understood that higher or lower numbers of lighting elements may be used on proportionally sized structures or as enhanced or decreased resolution is desired.

Figure 1A:
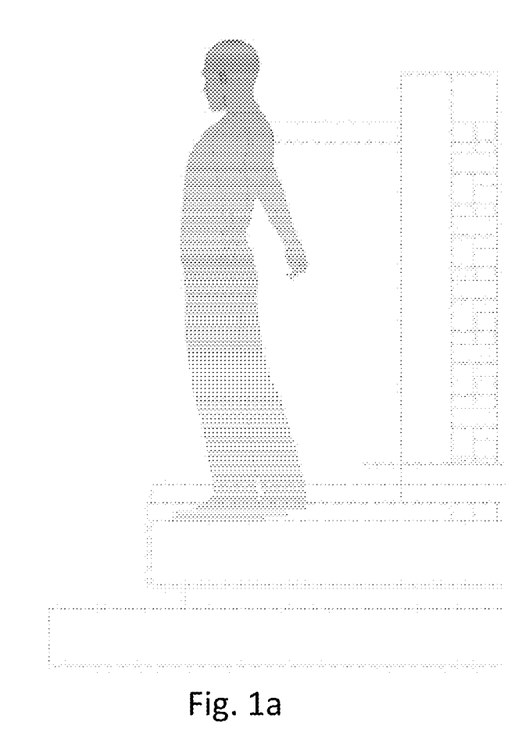
FIG. 1a is a first side view of an androgynous large scale statue.
Figure 1B:
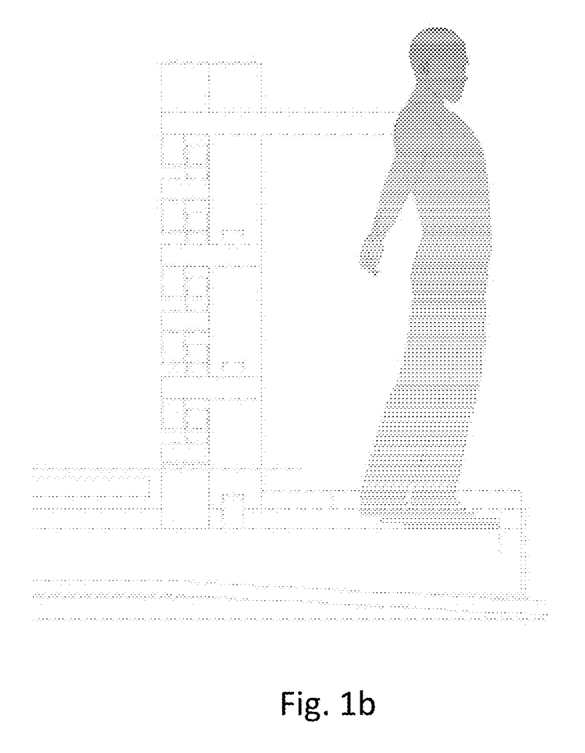
FIG. 1b is a second side view of an androgynous large scale statue.
Figure 1C:
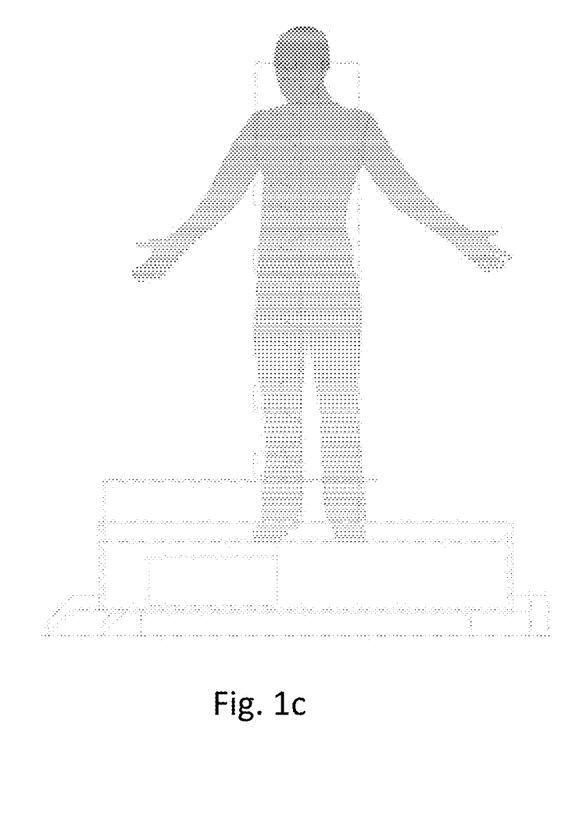
FIG. 1c is a front view of an androgynous large scale statue.
Figure 1D:
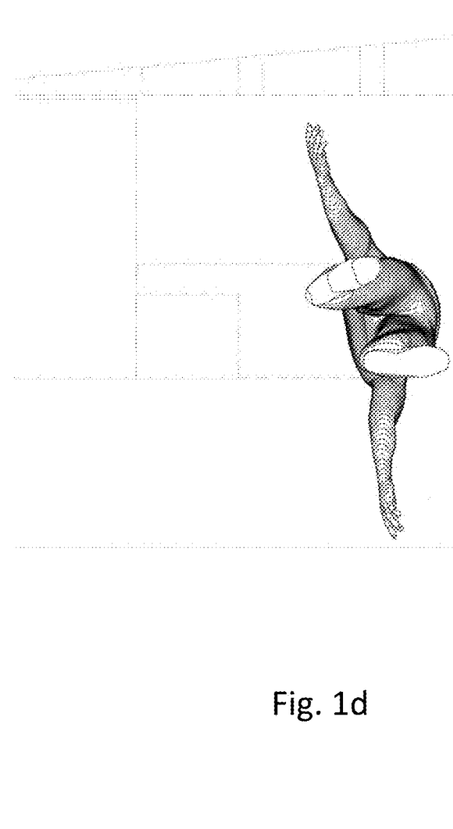
FIG. 1d is a bottom (underside) view of an androgynous large scale statue.
Figure 1E:
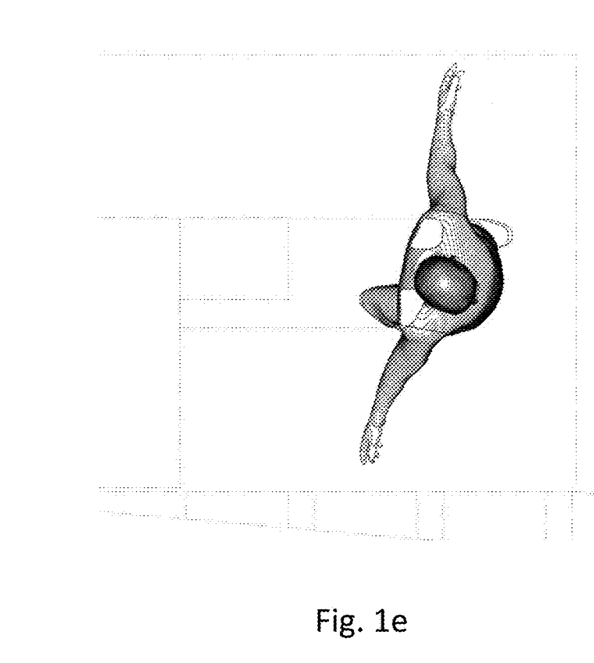
FIG. 1e is a top view of an androgynous large scale statue.
Figure 1F:
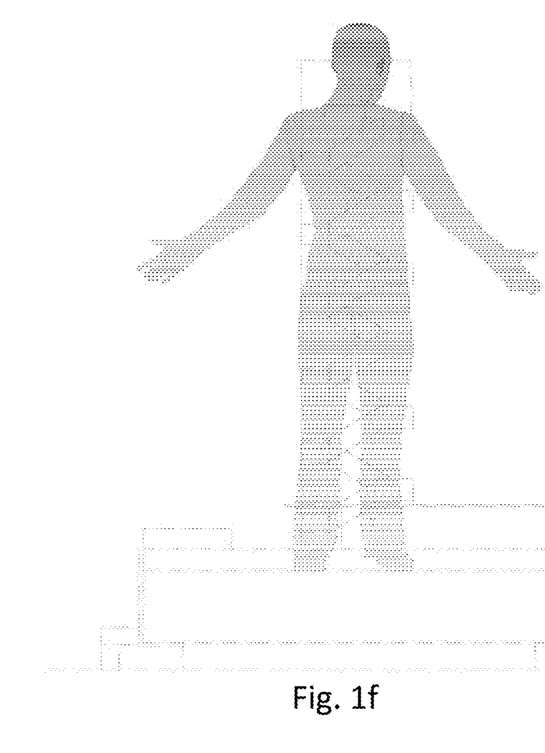
FIG. 1f is a back view of an androgynous large scale statue.
Figure 2:
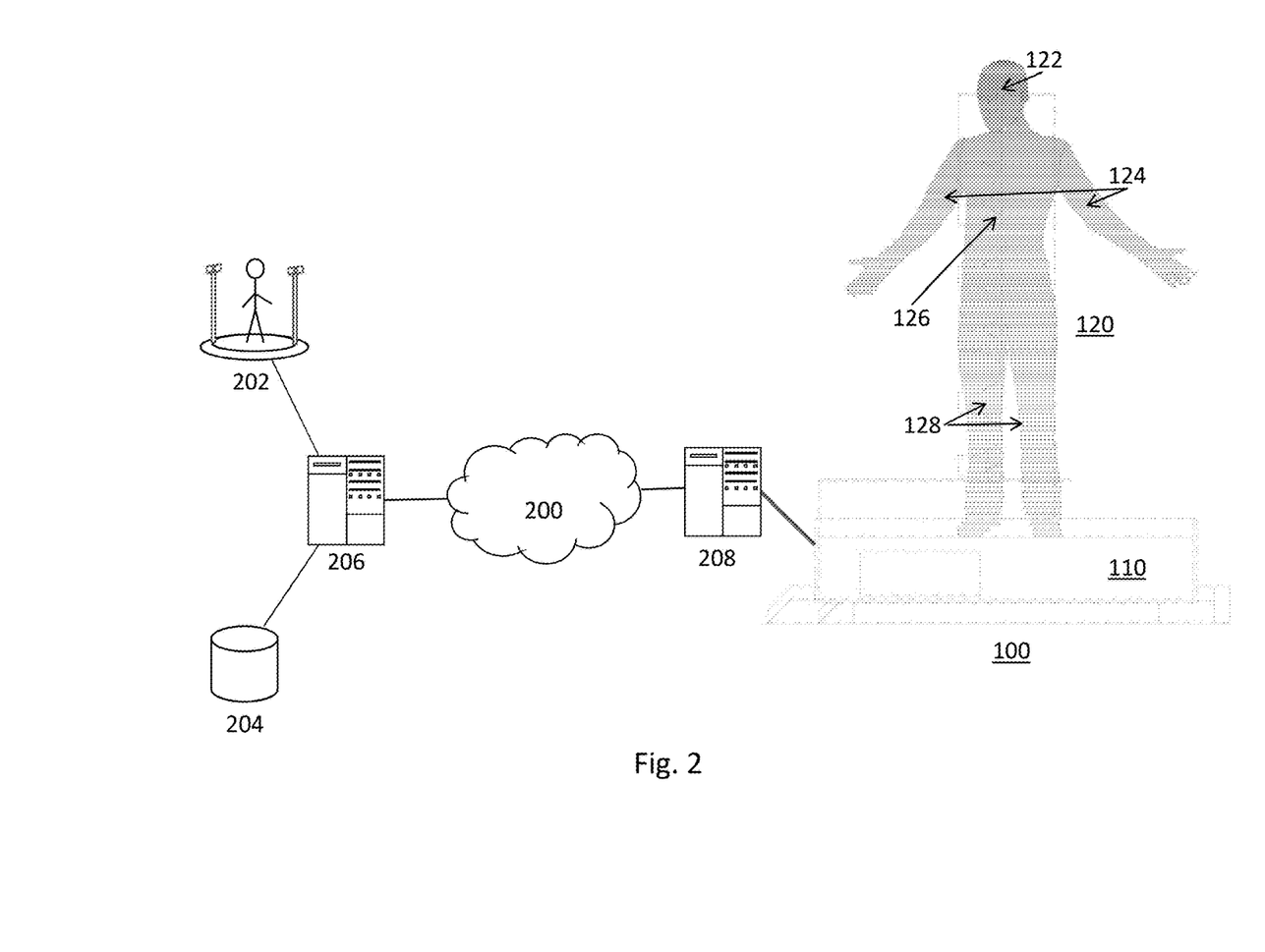
FIG. 2 is a block diagram of the system for one embodiment of the VISUAL MODELING SYSTEM.

Referring to FIG. 2, a block diagram of the visual modeling system is illustrated. The system in one embodiment includes a 3D scanner 202 that is used to scan visitors to the attraction. The system also may include a storage unit 204 and database to buffer or store scanned data. In addition to image data received from the 3D scanner 202, the system and method may receive or use previously scanned or generated data, either stored on storage unit 204 or streamed in real time to be displayed on the large scale model. While the images in one embodiment preferably relate to the form of the sculpture, the images may be any photographic imagery or any of a myriad of static or moving visual images—either representational or abstract.

Hardware

In one embodiment as shown in FIG. 2, the VISUAL MODELING SYSTEM may include one or more servers 206, 208. In other embodiments the entire systems may be self-contained and operate from a single server. The servers 206, 208 may be of any known type of readily available system including a processor, memory and communication ports as such for receiving and transmitting data from and to external devices via any known data receiving and transmitting hardware and software modules.

The server or servers 206, 208 may be connected to and/or communicate with entities such as, but not limited to: one or more users from user input devices such as keyboard and mice to control the system peripheral devices such as scanner 202 or other devices such as a positional input device (e.g., to allow a user to control movement of the large scale structure); and output controllers to activate and command control circuitry (e.g., to power and control the lighting element matrix and the motion actuators in the large scale structure).

As shown in FIG. 2, the visual modeling system is distributed and includes two or more computers or servers 206, 208 connected by a communications network 200. In such embodiments the scanning and storage system may be adjacent to or remote to the large scale structure. For example, in this configuration the large scale structure could be used to permit remote performances, speeches, or presentations wherein a singer, actor, or speaker can make an appearance before a large audiences at varied locations in real time by transmitting a live feed to multiple large scale "Giant" structures located around the country or world via the communications network 200.

The network 200 facilitates the transfer of information from source points to destinations. There are many forms of networks that may be suitable for use, such as, Local Area Networks (LANs), Pico networks, Wide Area Networks (WANs), Wireless Networks (WLANs), etc. For example, the Internet is generally accepted as being an interconnection of a multitude of networks whereby remote clients and servers may access and interoperate with one another and may be used to facilitate such remote video and imagery transmission to the large scale sculpture.

Software

The visual modeling system also includes software modules including a communications module, mapping engine, a controller module and movement processing engine. The communications module is any known interface module using standard communications protocols to communicate over Local Area Networks (LANs), Pico networks, Wide Area Networks (WANs), Wireless Networks (WLANs), and with peripheral devices such as scanner 202, storage unit 204 and an electronic control system for controlling the lighting matrix. The mapping engine and controller module software may be separate modules or be combined into a single module.

The function of the mapping engine is to transform the image data to the 3D lighting element matrix on the large scale "Giant" structure. This process is preferably carried out by relational mapping of the scanned or stored image data to the lighting matrix. The process may include use of known downscaling or down sampling algorithms (e.g., nearest neighbor, linear, cubic, or bicubic) to reduce the resolution of the original which will typically be higher than the resolution of the light element matrix on the large scale structure. Where a high pixel density is used on the large scale structure upscaling or up sampling may be necessary and can be carried by any similar known techniques. In some embodiments, since the pixel resolution or density varies across the large scale structure selective up scaling or downscaling may be used on portions of the image to map the image to the lighting matrix of the large scale Giant structure. For example, in a human form embodiment, where the face has a high pixel density in certain embodiments upscaling may be necessary, whereas, the legs and arms of the large scale structure may have low pixel density and may need to be downscaled to map to the lighting element matrix.

The controller module interfaces with a lighting control system that addressably energizes the lighting elements. The lighting elements may be addressed by any known method used in conjunction with traditional LED displays, such as, arranging the light elements in a passive matrix and using multiplexing techniques to reduce the number of physical connections. Alternatively, the lighting element matrix may be configured using active matrix techniques to provide faster response times in video and multimedia version of the system and method.

The lighting control system circuitry may also include power source and/or lighting control for the lighting element matrix and may be wired in a combination of series and parallel configurations using an AC mains voltage supply transformed to a lower voltage and rectified to a stabilized DC output. Pulse width modulation may be used for dimming the lighting elements. Data communications may use a TCP/IP based protocol, such as Artnet or sACN, or other protocols described above for fast display of lighting changes.

The control module provides the software communications interface with the lighting control system, and in some embodiments provides the commands to drive the lighting sequence of the lighting element matrix. In alternative embodiments the control module functions and lighting control system may be combined in a single unit for example in server 208 in base 110.

The movement processing engine provides software for receiving movement data and relating the movements into commands to control actuators on the Giant. Movement data may be received from movement sensors attached to a user, scans of the user's movements, or from a movement file stored in memory. The movement processing engine is connected directly or wirelessly the via servers or controllers to actuators controlling the Giant's appendages, and sends movement commands to the actuators to create movement.

Using the hardware and systems of FIG. 2, the content for the lighting element matrix, movement and audio may be generated in a real time or nearly real time interactive program that uses video streams from cameras and face detection algorithms to capture images and videos, movements and sounds such as of human figures or faces. These images are then processed to derive abstract images or motion pictures that are mapped onto the lighting element matrix. The mapping may be implemented using known coding environments and techniques, including, visual live programming environments. Similarly, as discussed above, the scanned or computer generated images, video and/or audio may be loaded onto a flash memory data storage card which is inserted into a media player to be mapped to the lighting element matrix.

Flow Diagram

Figure 3:
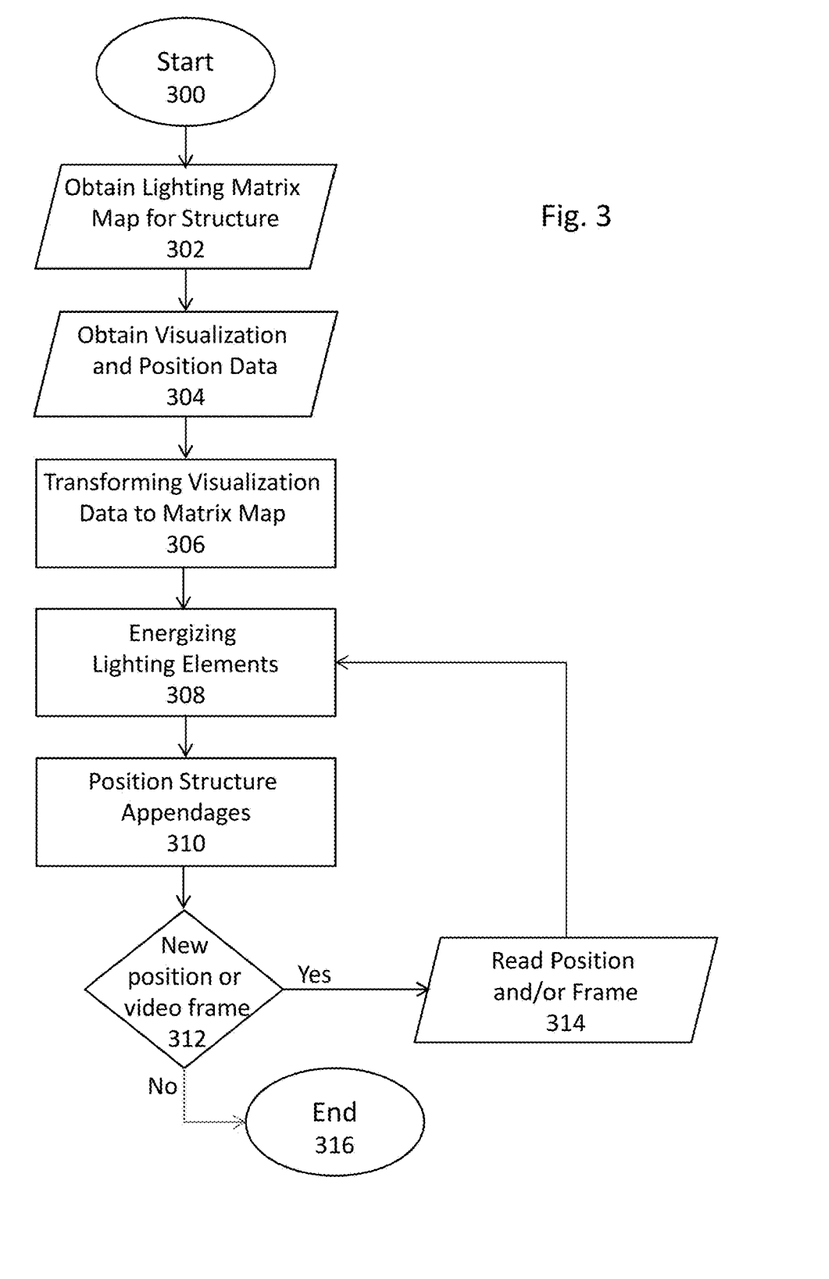
FIG. 3 is a logic flow diagram illustrating a method of implementing one embodiment of the VISUAL MODELING SYSTEM.

Referring to FIG. 3, a flow diagram of one embodiment is illustrated. The exemplary flow diagram illustrates how the system may function at a tourist attraction. The process starts at 300 with a visitor or user entering the attraction. At start-up the system would load a lighting matrix map of the addressable lighting element layout for the large scale Giant structure in Step 302. Next the system will load or scan data associated with the visitor (e.g., scan data set) in Step 304. In one embodiment, the visitor preferably steps into a 3D scanner upon entry to the attraction. The 3ED scanner in turn scans the visitor and generates visualization and/or position data for the visitor. The visualization data is essentially a scan of both the visitor's 3D form and image data. The position data may optionally be used to pose the large scale structure's appendages to match those of the visitor, or with a real time scanner to read the visitors movement and move the structure in sync with the visitor's movements.

In Step, 306 the mapping engine transforms and maps the visualization data such as the visitor's image data onto the matrix map for the lighting elements using upscaling, downscaling and/or relational mapping as discussed above. In step 308, the lighting control system and module, energize the lighting elements in accordance with the transformed visualization data.

In embodiments having moveable appendages, in Step 310 the appendages are positioned using the control module and system to move actuators in the arms, legs, neck and torso to pose the structure in accordance with the visitor's movements. In systems configured for interactive or real-time video or movement, in Step 312, the system will look for updated frame or movement data. Information on movement may be read from a 3D scanner, other sensors or actuators attached to or controlled by the visitor or from a prerecorded movement file stored in storage. Similarly, image or video data may be retrieved from real time scans or from prerecorded video in the storage system. If there are additional movements or video from the next frame of movement and display, the data is retrieved in Step 314. Thereafter the process repeats, displaying and positioning the figure according to the next frame in Steps 308 through 310. This process may repeat until the entire video is played or some allotted period of time for the visitor expires and the process ends at Step 316.

The Steps 310-316, may also be accompanied by audio or sound in sync with the image display and movement of the Giant. In some embodiments, the audio is from the user or visitor engaged with the Giant. In other embodiments, the audio may be part of a recorded video segment such as from a speech.

In order to address various issues and advances in the art, the entirety of this application for VISUAL MODELING APPARATUSES, METHODS AND SYSTEMS (including the Cover Page, Title, Headings, Field, Background, Summary, Brief Description of the Drawings, Detailed Description, Claims, Abstract, Figures, and otherwise) shows, by way of illustration, various embodiments in which the claimed innovations may be practiced. The advantages and features of the application are of a representative sample of embodiments only, and are not exhaustive and/or exclusive. They are presented only to assist in understanding and teaching the claimed principles. It should be understood that they are not representative of all claimed innovations. As such, certain aspects of the disclosure have not been discussed herein and that alternate embodiments may not have been presented for a specific portion of the innovations or that further undescribed alternate embodiments may be available for a portion is not to be considered a disclaimer of those alternate embodiments.

It will be appreciated that many of those undescribed embodiments incorporate the same principles of the innovations and others are equivalent. Thus, it is to be understood that other embodiments may be utilized and functional, logical, operational, organizational, structural and/or topological modifications may be made without departing from the scope and/or spirit of the disclosure. As such, all examples and/or embodiments are deemed to be non-limiting throughout this disclosure. Also, no inference should be drawn regarding those embodiments discussed herein relative to those not discussed herein other than it is as such for purposes of reducing space and repetition. For instance, it is to be understood that the logical and/or topological structure of any combination of any program components (a component collection), other components and/or any present feature sets as described in the figures and/or throughout are not limited to a fixed operating order and/or arrangement, but rather, any disclosed order is exemplary and all equivalents, regardless of order, are contemplated by the disclosure. Furthermore, it is to be understood that such features are not limited to serial execution, but rather, any number of threads, processes, services, servers, and/or the like that may execute asynchronously, concurrently, in parallel, simultaneously, synchronously, and/or the like are contemplated by the disclosure.

As such, some of these frames may be mutually contradictory, in that they cannot be simultaneously present in a single embodiment. Similarly, some features are applicable to one aspect of the innovations, and inapplicable to others. In addition, the disclosure includes other innovations not presently claimed. Applicant reserves all rights in those presently unclaimed innovations including the right to claim such innovations, file additional applications, continuations, continuations in part, divisions, and/or the like thereof, As such, it should be understood that advantages, embodiments, examples, functional, features, logical, operational, organizational, structural, topological, and/or other aspects of the disclosure are not to be considered limitations on the disclosure as defined by the claims or limitations on equivalents to the claims, It is to be understood that, depending on the particular needs and/or characteristics of a VISUAL MODELING SYSTEM individual and/or enterprise user, database configuration and/or relational model, data type, data transmission and/or network framework, syntax structure, and/or the like, various embodiments of the VISUAL MODELING SYSTEM, may be implemented that enable a great deal of flexibility and customization. While various embodiments and discussions of the VISUAL MODELING SYSTEM which have been included are described, it is to be understood that the embodiments described herein may be readily configured and/or customized for a wide variety of other applications and/or implementations.

What is claimed is:

1. A visual modeling system, comprising:
    a scan data set associated with a subject;
    a structure having a plurality of addressable lighting elements disposed approximate to a surface of the structure;
    a processor based image processing system including a data receiving module to receive the scan data set, and a mapping engine to relate the scan data set to positionally corresponding addressable lighting elements of the plurality of addressable lighting elements on the structure; and
    an electronic lighting control system including a power source and a lighting controller in communication with the plurality of addressable lighting elements, wherein the electronic control system energizes the plurality of addressable lighting elements in accordance with the mapping engine relating the scan data set to the positionally corresponding addressable lighting elements.

2. The visual modeling system of claim 1, wherein the structure is formed in an approximate shape of a type of the subject.

3. The visual modeling system of claim 1, wherein:
    the scan data set is a three dimensional set of data, and
    the structure is formed in an approximate three dimensional shape of a type of the subject.

4. The visual modeling system of claim 3, further comprising:
    a three dimensional scanner for scanning the subject to be visually modeled.

5. The visual modeling system of claim 4, wherein the subject is a human and the structure is formed in a shape of a standing human figure.

6. The visual modeling system of claim 5, wherein the standing human shaped structure includes at least one of a moveably attached head, neck, arm, torso or leg and a powered actuator for moving the at least one of the movably attached head, neck, arm, torso or leg.

7. The visual modeling system of claim 6, wherein the system includes at least one movement sensor and movement processing engine to translate a movement of the subject into movement commands sent to the powered actuator whereby a user can control the movement of the structure.

8. The visual modeling system of claim 6, wherein the plurality of addressable lighting elements are outwardly facing light emitting diodes arranged in a plurality of vertically spaced horizontal rows, wherein a head and front portion of the torso have a higher density of light emitting diodes than a rest of a body, and wherein a face portion of the head has a higher density of light emitting diodes than the front portion of the head and torso.

9. The visual modeling system of claim 1, wherein the structure is at least ten times larger than the subject.

10. The visual modeling system of claim 1, wherein the scan data set is video and wherein the electronic lighting control system energizes the plurality of addressable lighting elements to generate a moving image on the structure.

11. A method of generating a visual model comprising:
    scanning a subject to be visually modeled;
    generating a scan data set corresponding to the subject;
    providing a structure formed in an approximate shape of a type of the subject, wherein the structure is provided with a plurality of addressable lighting elements disposed approximate to a surface of the structure;
    receiving the scan data set at an image processor;
    processing the scan data set using a mapping engine to relate the scan data set to positionally corresponding addressable lighting elements of the plurality of addressable lighting elements on the structure; and
    energizing the plurality of addressable lighting elements via a processor enabled lighting control system including a power source and lighting controller in communication with the plurality of addressable lighting elements, the plurality of addressable lighting elements being energized in accordance with the mapping engine relating the scan data set to the positioning corresponding addressable lighting elements to reproduce a visual mode of the subject on the structure.

\* \* \* \* \*